United States Patent
Kim et al.

(10) Patent No.: US 7,489,492 B2
(45) Date of Patent: Feb. 10, 2009

(54) ABRUPT METAL-INSULATOR TRANSITION DEVICE, CIRCUIT FOR REMOVING HIGH-VOLTAGE NOISE USING THE ABRUPT METAL-INSULATOR TRANSITION DEVICE, AND ELECTRICAL AND/OR ELECTRONIC SYSTEM COMPRISING THE CIRCUIT

(75) Inventors: Hyun Tak Kim, Daejeon (KR); Kwang Yong Kang, Daejeon (KR); Bong Jun Kim, Daejeon (KR); Yong Wook Lee, Seoul (KR); Sun Jin Yun, Daejeon (KR); Byung Gyu Chae, Daejeon (KR); Gyung Ock Kim, Seoul (KR)

(73) Assignee: Electronics and Telecommunications Research Institute (KR)

( * ) Notice: Subject to any disclaimer, the term of this patent is extended or adjusted under 35 U.S.C. 154(b) by 0 days.

(21) Appl. No.: 12/021,764

(22) Filed: Jan. 29, 2008

(65) Prior Publication Data

US 2008/0142900 A1    Jun. 19, 2008

Related U.S. Application Data

(63) Continuation of application No. PCT/KR2006/001249, filed on Apr. 5, 2006.

(51) Int. Cl.
*H02H 3/22* (2006.01)
*H02H 9/04* (2006.01)

(52) U.S. Cl. .................. 361/111; 361/54; 361/56; 361/91.1; 361/118

(58) Field of Classification Search .......... 361/54, 361/56, 91.1, 111, 118
See application file for complete search history.

(56) References Cited

U.S. PATENT DOCUMENTS

| 5,912,611 | A | 6/1999 | Berggren et al. |
| 6,128,169 | A | 10/2000 | Neiger et al. |
| 6,594,133 | B1 | 7/2003 | Schmidt et al. |
| 6,714,427 | B1 | 3/2004 | Barthold |
| 6,826,026 | B2 | 11/2004 | Duvvury et al. |

OTHER PUBLICATIONS

International Search Report for PCT/KR2006/001249 dated Jul. 7, 2006.
Written Opinion for PCT/KR2006/001249 dated Jul. 7, 2006.

*Primary Examiner*—Evan Pert
(74) *Attorney, Agent, or Firm*—Cantor Colburn LLP

(57) ABSTRACT

Provided are an abrupt metal-insulator transition (MIT) device for bypassing super-high voltage noise to protect an electric and/or electronic system, such as, a high-voltage switch, from a super-high voltage, a high-voltage noise removing circuit for bypassing the super-high voltage noise using the abrupt MIT device, and an electric and/or electronic system including the high-voltage noise removing circuit. The abrupt MIT device includes a substrate, a first abrupt MIT structure, and a second abrupt MIT structure. The first and second abrupt MIT structures are formed on an upper surface and a lower surface, respectively, of the substrate. The high-voltage noise removing circuit includes an abrupt MIT device chain connected in parallel to the electric and/or electronic system to be protected. The abrupt MIT device chain includes at least two abrupt MIT devices serially connected to each other.

32 Claims, 7 Drawing Sheets

ABRUPT METAL-INSULATOR TRANSITION DEVICE, CIRCUIT FOR REMOVING HIGH-VOLTAGE NOISE USING THE ABRUPT METAL-INSULATOR TRANSITION DEVICE, AND ELECTRICAL AND/OR ELECTRONIC SYSTEM COMPRISING THE CIRCUIT

CROSS REFERENCE TO RELATED APPLICATIONS

This application is a continuation application of a PCT International Application, PCT/KR2006/001249, filed on Apr. 5, 2006, which claims priority to Korean Patent Application No. 10-2005-0069805 filed on Jul. 29, 2005 and Korean Patent Application No. 10-2005-0124045 filed on Dec. 15, 2005. The PCT International Application was published in English on Feb. 1, 2007.

TECHNICAL FIELD

The present invention relates to an electronic device and a circuit for protecting an electrical and/or electronic system, and more particularly, to an abrupt metal-insulator transition (MIT) device, a circuit for removing high-voltage noise applied to an electrical and/or electronic system through a signal line or a power line by using the abrupt MIT device, and an electrical and/or electronic system comprising the circuit.

BACKGROUND ART

Noise that affects electrical and/or electronic components flows in through a power line that transmits power to an electric and electronic system and a signal line that receives and outputs an electrical signal from and to the electric and electronic system. Accordingly, an electrical and/or electronic system protecting circuit is installed between the power line and an internal electronic component or between the signal line and the internal electronic component. The electrical and/or electronic system protecting circuit is so important as to say that it is required by almost all electronic products including electron components.

A 800KV-$SF_6$ gas insulating switch gear (GIS) used in a substation, being an example of the electric and/or electronic components, is a high-voltage switch that blocks power transmission when electric leakage occurs in an electric and/or electronic system at a predetermined portion of a power-transmission line or an end portion thereof or when excessive current flows due to a sudden unexpected circumference. The $SF_6$ gas is an insulating gas having a dielectric constant at least two times greater than that of the air.

When the switch is opened or closed because of an unexpected accident, spike current greater than a transmitted voltage may flow in the electric and/or electronic system at this time, the insulating gas or hardenable synthetic resin is destroyed, and the temperature of the switch increases, leading to an explosion of the switch. Additionally, if the substation is struck by lightening, a high-voltage line and the switch may be broken. If these things happen, power transmission should suspend, causing great economical losses. Therefore, an insulator destruction monitoring system is made to monitor the high-voltage switch.

Insulator destruction occurs because, when a high-voltage noise signal having a voltage greater than a rated voltage, particularly, a super-high voltage noise signal, is applied, current is concentrated through impurities included in an insulating material, causing interruption of uniform flow of current and destruction of an insulating material due to an increase in the temperature of the insulating material. Hence, the super-high voltage noise signal having a voltage greater than the rated voltage should bypassed in order to prevent insulator destruction.

High-voltage noise is generally removed by a varistor which is a semiconductor resistance element. A ceramic varistor formed of ZnO has been used to bypass super-high voltage noise. However, because the ceramic varistor should have a great internal resistance, there is a limit in reducing the size of the ceramic varistor. Furthermore, the ceramic varistor cannot completely remove the super-high voltage noise because of the internal resistance and can only relatively reduce the magnitude of the noise according to the magnitude of the internal resistance. However, the ceramic varistor is the only current solution to remove high-voltage noise.

For example, U.S. Pat. Nos. 5,912,611 and 6,594,133 disclose a serge arrester that arrests serge voltage by using a ceramic varistor similar to the above-described ceramic varistor. However, the serge arrester is unable to remove super-high voltage that is greater than 800KV.

DISCLOSURE OF THE INVENTION

The present invention provides an abrupt metal-insulator transition (MIT) device for bypassing super-high voltage noise to protect an electric and/or electronic system, such as, a high-voltage switch, from a super-high voltage, a high-voltage noise removing circuit that bypasses the super-high voltage noise using the abrupt MIT device, and an electric and/or electronic system including the high-voltage noise removing circuit.

According to an aspect of the present invention, there is provided an abrupt metal-insulator transition (MIT) device including a substrate, a first abrupt MIT structure, and a second abrupt MIT structure. The first and second abrupt MIT structures are formed on an upper surface and a lower surface, respectively, of the substrate.

Each of the first and second abrupt MIT structures has a characteristic of an insulator below a predetermined limit voltage and has a characteristic of a metal at or over the limit voltage.

Each of the first and second abrupt MIT structures includes an abrupt MIT thin film and at least two electrode thin films contacting the abrupt MIT thin film.

The abrupt MIT thin film may be formed of at least one material selected from the group consisting of an inorganic semiconductor to which low-concentration holes are added, an inorganic insulator to which low-concentration holes are added, an organic semiconductor to which low-concentration holes are added, an organic insulator to which low-concentration holes are added, a semiconductor to which low-concentration holes are added, an oxide semiconductor to which low-concentration holes are added, and an oxide insulator to which low-concentration holes are added, wherein the above-described materials each include at least one of oxygen, carbon, a semiconductor element (i.e., groups III-V and groups II-IV), a transition metal element, a rare-earth element, and a lanthanum-based element.

The abrupt MIT thin film may be formed of at least one material selected from the group consisting of W, Mo, W/Au, Mo/Au, Cr/Au, Ti/W, Ti/Al/N, Ni/Cr, Al/Au, Pt, Cr/Mo/Au, $YB_2Cu_3O_{7-d}$, Ni/Au, Ni/Mo, Ni/Mo/Au, Ni/Mo/Ag, Ni/Mo/Al, Ni/W, Ni/W/Au, Ni/W/Ag, and Ni/N/Al.

According to another aspect of the present invention, there is provided a high-voltage noise removing circuit including an abrupt MIT device chain connected in parallel to an electric and/or electronic system to be protected, wherein the abrupt MIT device chain comprises at least two abrupt MIT devices serially connected to each other.

The electric and/or electronic system may be a high-voltage switch which blocks a high voltage. The abrupt MIT device chain has an overall limit voltage corresponding to a sum of the limit voltages of the abrupt MIT devices. When a voltage equal to or greater than the overall limit voltage is applied, each of the abrupt MIT devices transits from an insulator characteristic to a metallic characteristic, and the transitions of the abrupt MIT devices occur simultaneously. The high-voltage noise removing circuit may further include at least one abrupt MIT device chain to be connected in parallel to the already included abrupt MIT device chain.

According to another aspect of the present invention, there is provided a high-voltage noise removing circuit including an abrupt MIT device connected in parallel to an electric and/or electronic system to be protected, including a substrate and an abrupt MIT device chain obtained by serially connecting at least two abrupt MIT structures.

The abrupt MIT device chain may include: a first abrupt MIT device chain formed on the upper surface of the substrate, including at least two abrupt MIT structures serially connected to each other; and a second abrupt MIT device chain formed on the lower surface of the substrate, including at least two abrupt MIT structures serially connected to each other. The first and second abrupt MIT device chains may be connected to each other in parallel by a parallel contact line that penetrates the substrate.

According to another aspect of the present invention, there is provided an electric and/or electronic system comprising: an electric and/or electronic system to be protected; and a high-voltage noise removing circuit including an abrupt MIT device chain connected in parallel to the electric and/or electronic system, the abrupt MIT device chain obtained by serially connecting at least two abrupt MIT devices to each other.

The high-voltage noise removing circuit may further include at least one abrupt MIT device chain to be connected in parallel to the already included abrupt MIT device chain.

BEST MODE FOR CARRYING OUT THE INVENTION

Figure 1:
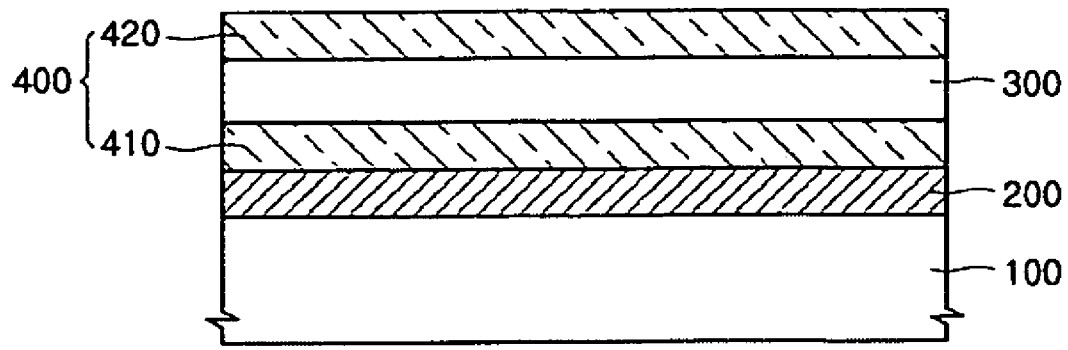
FIG. 1 is a cross-section of a stacked-type abrupt MIT device applied to the present invention.

The present invention will now be described more fully with reference to the accompanying drawings, in which exemplary embodiments of the invention are shown. The invention may, however, be embodied in many different forms and should not be construed as being limited to the embodiments set forth herein; rather, these embodiments are provided so that this disclosure will be thorough and complete, and will fully convey the concept of the invention to those skilled in the art. In the drawings, the thicknesses of layers and regions are exaggerated for clarity. To facilitate understanding, identical reference numerals have been used, where possible, to designate identical elements that are common to the figures.

The present invention proposes a new medium and a high-voltage noise removing circuit which removes static electricity or high-voltage high frequency noise from an electrical and/or electronic system by using the new medium whose electrical characteristics abruptly vary according to a voltage level of a received signal. The new medium is referred as a metal-insulator transition (MIT) device.

An abrupt MIT device used in the present invention includes an abrupt MIT thin film (hereinafter, referred to as a transition thin film) and a first electrode thin film and a second electrode thin film that contact the transition thin film. The abrupt MIT device may have either a stacked (or vertical) structure or a planar-type structure according to the locations of the transition thin film and the first and second electrode thin films.

FIG. 1 is a vertical cross-section of an abrupt MIT device having a stacked structure which is applied to the present invention. Referring to FIG. 1, the abrupt MIT device having a stacked structure includes a substrate 100, a buffer layer 200 formed on the substrate 100, and a first electrode thin film 410, a transition thin film 300, and a second electrode thin film 420 which are sequentially formed on the buffer layer 200.

The buffer layer 200 buffers a lattice mismatch between the substrate 100 and the first electrode thin film 410. When the lattice mismatch between the substrate 100 and the first electrode thin film 410 is very small, the first electrode thin film 410 may be formed directly on the substrate 100 without the buffer layer 200. The buffer layer 200 may include a $SiO_2$ or $Si_3N_4$ film.

Each of the first and second electrode thin films 410 and 420, which constitute an electrode thin film 400, is formed of at least one material of W, Mo, W/Au, Mo/Au, Cr/Au, Ti/W, Ti/Al/N, Ni/Cr, Al/Au, Pt, Cr/Mo/Au, $YB_2Cu_3O_{7-d}$, and Ni/Mo/Au. The substrate 100 is formed of at least one material of Si, $SiO_2$, GaAs, $Al_2O_3$, plastic, glass, $V_2O_5$, $PrBa_2Cu_3O_7$, $YBa_2Cu_3O_7$, MgO, $SrTiO_3$, Nb-doped $SrTiO_3$, and silicon-on-insulator (SOI).

Figure 2A:
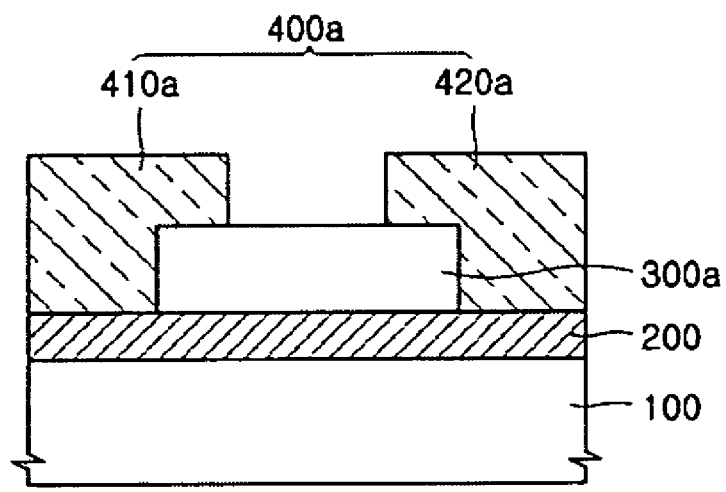
FIG. 2A is a cross-section of a planar-type abrupt MIT device applied to the present invention.

FIG. 2A is a vertical cross-section of an abrupt MIT device having a planar-type structure which is applied to the present invention. Referring to FIG. 2A, the abrupt MIT device having a planar-type structure includes a substrate 100, a buffer layer 200 formed on the substrate 100, a transition thin film 300a formed on a part of the upper surface of the buffer layer 200, and a first electrode thin film 410a and a second electrode thin film 420a which are formed on exposed portions of the buffer layer 200 and cover lateral surfaces and parts of the upper surface of the transition thin film 300a so as to face each other. In other words, the first and second electrode thin films 410a and 420a are separated from each other by the transition thin film 300a formed therebetween.

The buffer layer 200 buffers a lattice mismatch between the transition thin film 300a and the substrate 100. When the lattice mismatch between the substrate 100 and the transition thin film 300a is very small, the transition thin film 300a may be formed directly on the substrate 100 without the buffer layer 200.

Of course, the buffer layer 200, the first and second electrode thin films 410a and 420a, and the substrate 100 may be formed of the materials used to form the buffer layer 200, the first and second electrode thin films 410 and 420, and the substrate 100 of FIG. 1, respectively. The first and second electrode thin films 410a and 420a constitute an electrode thin film 400a.

The electrical conductivities of the transmission thin films 300 and 300a change abruptly at a specific voltage due to abrupt MIT. However, although abrupt MIT occurs, the structures of the transition thin films 300 and 300a do not change.

The transition thin films 300 and 300a may be obtained by suitably adding low-concentration holes to an insulator. A mechanism for an abrupt MIT caused due to an addition of low-concentration holes to an insulator is disclosed in some papers, namely, New J. Phys. 6 (2004) 52 and http//xxx.lan-l.gov/abs/cond-mat/0411328 and Appl. Phys. Lett. 86 (2005) 242101, and U.S. Pat. No. 6,624,463.

Each of the transition thin films 300 and 300a, which cause an abrupt MIT to occur in the abrupt MIT devices of FIGS. 1 and 2A, may be formed of at least one material selected from the group consisting of a p-type inorganic semiconductor to which low-concentration holes are added, a p-type inorganic insulator to which low-concentration holes are added, a p-type organic semiconductor to which low-concentration holes are added, a p-type organic insulator to which low-concentration holes are added, a p-type semiconductor to which low-concentration holes are added, a p-type oxide semiconductor to which low-concentration holes are added, and a p-type oxide insulator to which low-concentration holes are added. Each of the aforementioned materials includes at least one of oxygen, carbon, a semiconductor element (i.e., groups III-V and groups II-IV), a transition metal element, a rare-earth element, and a lanthanum-based element. The transition thin films 300 and 300a may also be formed of an n-type semiconductor-insulator having a very large resistance.

A voltage at which the electrical characteristic of the abrupt MIT device transits from an insulator to a metallic material is defined as a limit voltage. The limit voltage may vary according to the structures or materials of the components of the abrupt MIT device.

Figure 2B:
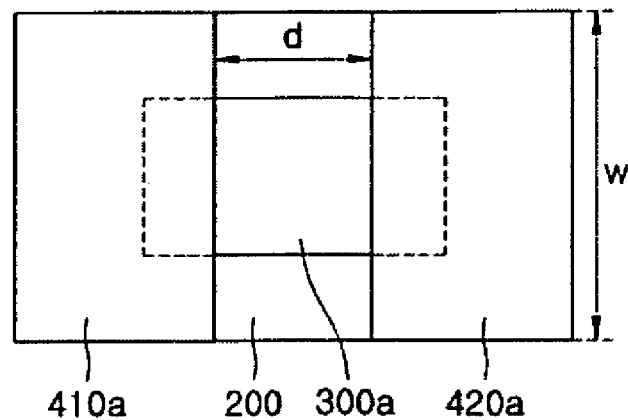
FIG. 2B is a plan view of the planar-type abrupt MIT device of FIG. 2A.

FIG. 2B is a plan view of the planar-type abrupt MIT device of FIG. 2A. In FIG. 2B, the buffer layer 200, the transition thin film 300a, and the first and second electrode thin films 410a and 420a are illustrated. The limit voltage for the planar-type abrupt MIT device may vary according to structures of the components of the abrupt MIT device, for example, according to a change in the distance d between the electrode thin films 410a and 420a or a change in the width w of each of the first and second electrode thin films 410a and 420a.

Figure 3:
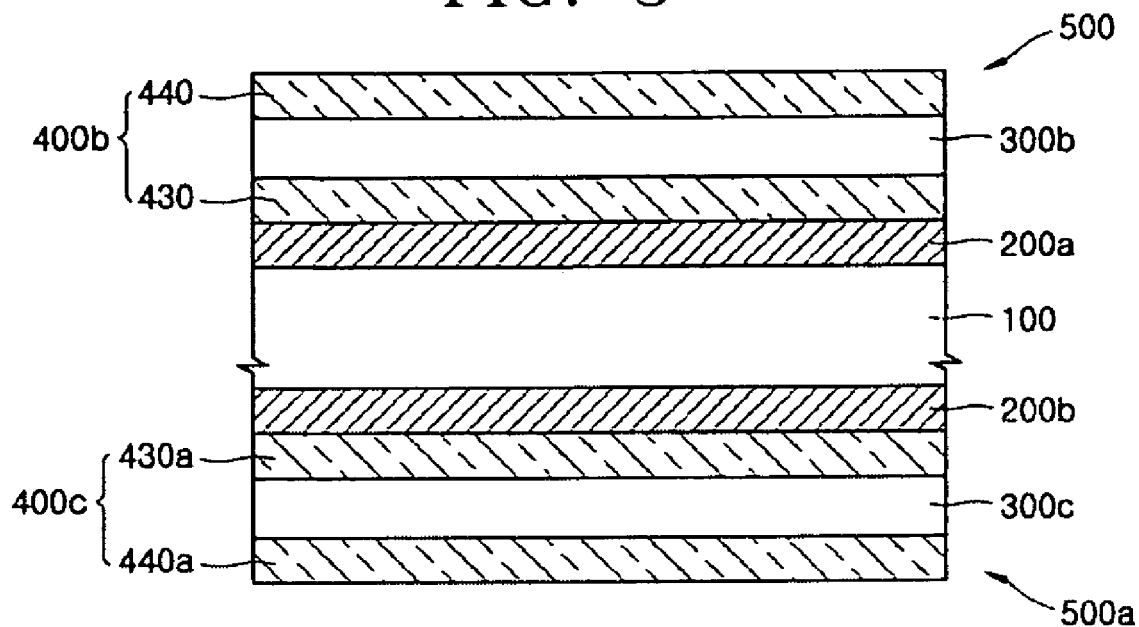
FIG. 3 is a cross-section of a double-sided stacked-type abrupt MIT device according to an embodiment of the present invention.

FIG. 3 is a cross-section of a double-sided stacked-type abrupt MIT device according to an embodiment of the present invention. Referring to FIG. 3, the double-sided stacked-type abrupt MIT device includes a substrate 100, upper and lower buffer layers 200a and 200b formed on upper and lower surfaces, respectively, of the substrate 100, a first abrupt MIT structure 500 formed on the upper buffer layer 200a, and a second abrupt MIT structure 500a formed on the lower buffer layer 200b. The first abrupt MIT structure 500 includes a first electrode thin film 430 formed on the upper surface of the upper buffer layer 200a, a transition thin film 300b, and a second electrode thin film 440. The second abrupt MIT structure 500a includes a first electrode thin film 430a formed on the lower surface of the lower buffer layer 200b, a transition thin film 300c, and a second electrode thin film 440a.

Of course, the substrate 100, the electrode thin films 400b and 400c, and the transition thin films 300b and 300c may be formed of the materials mentioned in the description of FIG. 1. When the lattice mismatch between the substrate 100 and each of the electrode thin films 430 and 430a is small, the buffer layers 200a and 200b may be omitted.

In the embodiment of FIG. 3, the first and second abrupt MIT structures 500 and 500a are formed on the upper and lower surfaces of the single substrate 100, thereby forming two abrupt MIT devices. The two abrupt MIT devices may be connected to each other in parallel or in series by a conductive contact line formed in the substrate 100. This connection will be described later with reference to FIG. 5 and its following figures.

Figure 4:
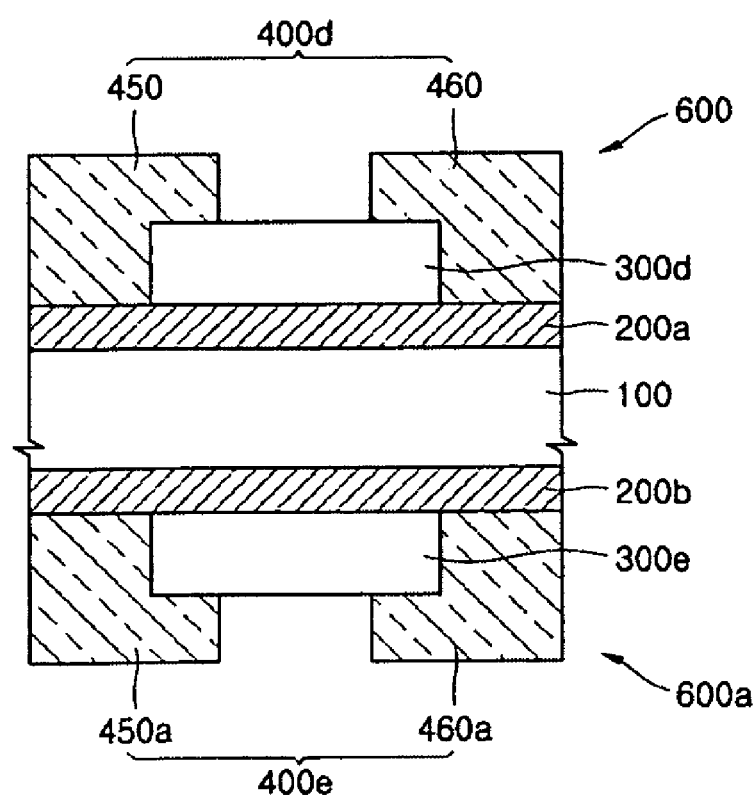
FIG. 4 is a cross-section of a double-sided planar-type abrupt MIT device according to another embodiment of the present invention.

FIG. 4 is a cross-section of a double-sided planar-type abrupt MIT device according to another embodiment of the present invention. Referring to FIG. 4, the double-sided planar-type abrupt MIT device includes a substrate 100, upper and lower buffer layers 200a and 200b formed on an upper surface and a lower surface, respectively, of the substrate 100, a first abrupt MIT structure 600 formed on the upper surface of the upper buffer layer 200a, and a second abrupt MIT structure 600a formed on the lower surface of the lower buffer layer 220b.

The first abrupt MIT structure 600 includes a transition thin film 300d formed on a part of the upper surface of the upper buffer layer 200a and a first electrode thin film 450 and a second electrode thin film 460 which are formed on exposed portions of the upper buffer layer 200a and cover the lateral surfaces and parts of the upper surface of the transition thin film 300d so as to face each other. The first electrode thin film 450 and the second electrode thin film 460 are separated from each other by the transmission thin film 300d formed therebetween.

The second abrupt MIT structure 600a includes a transition thin film 300e formed on a part of the lower surface of the lower buffer layer 200b and a first electrode thin film 450a and a second electrode thin film 460a which are formed on exposed portions of the lower buffer layer 200b and cover the lateral surfaces and parts of the lower surface of the transition thin film 300e so as to face each other. The first electrode thin film 450a and the second electrode thin film 460a are separated from each other by the transmission thin film 300e formed therebetween.

Of course, the substrate 100, the electrode thin films 400d and 400e, and the transition thin films 300d and 300e may be formed of the materials mentioned in the description of FIG. 1. The buffer layers 200a and 200b may be omitted. As described above with reference to FIG. 3, the first and second abrupt MIT structures 600 and 600a may be connected to each other in parallel or in series by a conductive contact line.

Figure 5:
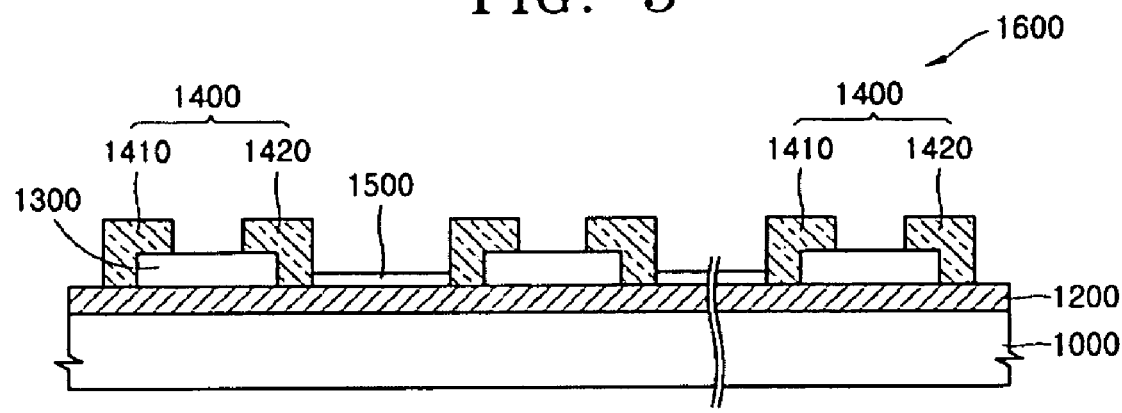
FIG. 5 is a cross-section of a one-sided abrupt MIT device including a plurality of planar abrupt MIT thin film structures, according to another embodiment of the present invention.

FIG. 5 is a cross-section of a one-sided abrupt MIT device including a plurality of planar abrupt MIT thin film structures, according to another embodiment of the present invention. Referring to FIG. 5, the one-sided stacked-type abrupt MIT device includes a substrate 1000, a buffer layer 1200 formed on an upper surface of the substrate 1000, and a plurality of abrupt MIT structures. Each of the abrupt MIT structures includes a transition thin film 1300 formed on a part of the upper surface of the buffer layer 1200, and a first electrode thin film 1410 and a second electrode thin film 1420 which are formed on exposed portions of the transition thin film 1300 and cover the lateral surfaces and parts of the upper surface of the transition thin film 1300 so as to face each other. The first and second electrode thin films 1410 and 1420 constitute an electrode thin film 1400.

In the embodiment of FIG. 5, the one-sided stacked-type abrupt MIT device includes the plurality of abrupt MIT structures which are formed on the substrate 1000, spaced apart from each other, and connected to each other by a conductive serial contact line 1500. The abrupt MIT structures electrically, serially connected to each other by the serial contact line 1500 constitute an abrupt MIT device chain 1600. In other words, when voltages are applied to the first electrode thin film 1410 of an abrupt MIT structure located at the leftmost side of the abrupt MIT device chain 1600 and the second electrode thin film 1420 of an abrupt MIT structure located at the rightmost side of the abrupt MIT device chain 1600, all of the abrupt MIT structures are serially connected to one another.

As in the embodiment of FIG. 5, the serial connection between the abrupt MIT structures can be easily achieved by the serial contact line 1500 formed on the buffer layer 1200. Although the abrupt MIT structures one-dimensionally formed on the substrate 1000 are illustrated in FIG. 5, the abrupt MIT structures may be formed two-dimensionally on the substrate 1000 and connected to one another in parallel or in series by suitable contact lines. The abrupt MIT structures may be formed simultaneously.

Of course, the substrate 100, the electrode thin films 1400, and the transition thin films 1300 may be formed of the materials mentioned in the description of FIG. 1. Of course, the buffer layer 1200 may be omitted. Although planar abrupt MIT structures are used in the embodiment of FIG. 5, stacked abrupt MIT structures may be used. The electrical characteristics generated due to a serial connection between abrupt MIT devices or abrupt MIT structures will be described later in greater detail with reference to the graphs of FIGS. 10A through 10E.

Figure 6:
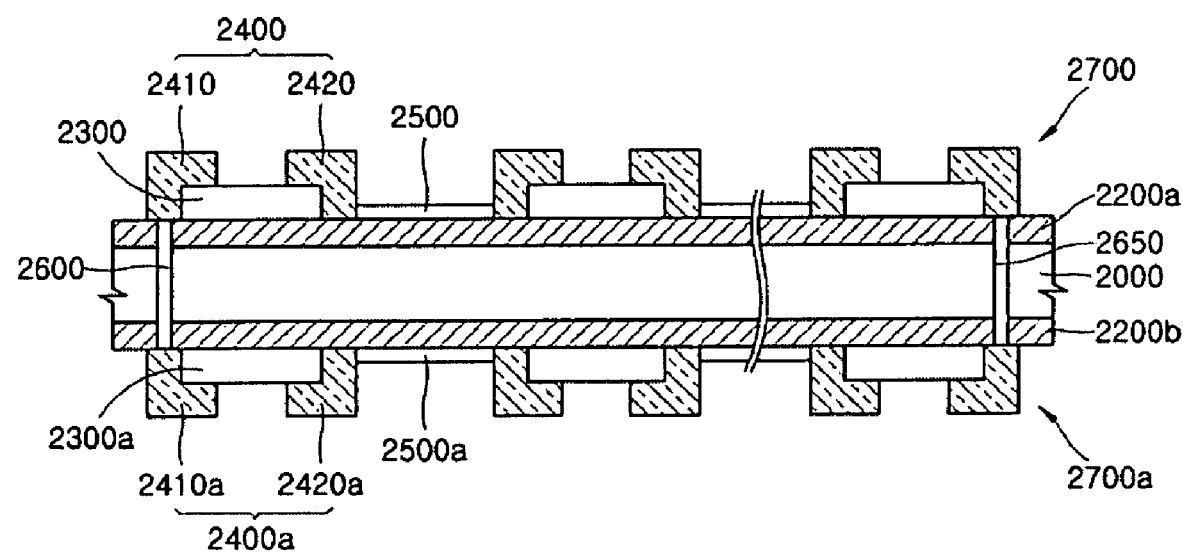
FIG. 6 is a cross-section of a double-sided abrupt MIT device including a plurality of planar abrupt MIT thin film structures, according to another embodiment of the present invention.

FIG. 6 is a cross-section of a double-sided abrupt MIT device including a plurality of planar abrupt MIT structures, according to another embodiment of the present invention. The double-sided abrupt MIT device of FIG. 6 is similar to the one-sided abrupt MIT device of FIG. 5 except that a plurality of abrupt MIT structures are formed on the lower surface of a substrate 2000. In other words, the double-sided abrupt MIT device of FIG. 6 comprises a first abrupt MIT device chain 2700 made up of a plurality of planar abrupt MIT structures formed over the substrate 2000 and serially connected to one another, and a second abrupt MIT device chain 2700a made up of a plurality of planar abrupt MIT structures formed under the substrate 2000 and serially connected to one another. The planar abrupt MIT structures formed on the upper surface of the upper buffer layer 2200a are serially connected to one another by a serial contact line 2500. The planar abrupt MIT structures formed on the lower surface of the lower buffer layer 2200b are serially connected to one another by a serial contact line 2500a.

In the embodiment of FIG. 6, the first and second abrupt MIT device chains 2700 and 2700a are connected to each other in parallel by conductive parallel contact lines 2600 and 2650 which penetrate the substrate 2000 and the buffer layers 2200a and 2200b. In other words, the parallel connection between the first and second abrupt MIT device chains 2700 and 2700a is achieved by applying voltages to a first electrode thin film 2410 or 2410a of an abrupt MIT structure located at the leftmost side of the first or second abrupt MIT device chain 2700 or 2700a and a second electrode thin film 2420 or 2420a of an abrupt MIT structure located at the rightmost side of the first or second abrupt MIT device chain 2700 or 2700a. One of the parallel contact lines 2600 and 2650 may be omitted. If the parallel contact line 2600 is omitted, the upper and lower abrupt MIT structures may be serially connected to each other by applying voltages to the first electrode thin films 2410 and 2410a of the upper and lower abrupt MIT structures.

When abrupt MIT devices need to be connected to each other in parallel and in series, the serial and parallel connections can be easily achieved by forming the plurality of abrupt MIT structures, the serial contact lines 2500 and 2500a, and the parallel contact lines 2600 and 2650 on the upper and lower surfaces of the substrate 2000 as in the embodiment of FIG. 6. Alternatively, the serial and parallel connections between the abrupt MIT structures may be achieved by two-dimensionally forming the abrupt MIT structures on the upper and lower surfaces of the substrate 2000 as described above in the embodiment of FIG. 5.

The abrupt MIT structures on the upper and lower surfaces of the substrate 200 may be formed simultaneously. Of course, the substrate 2000, electrode thin films 2400 and 2400a, and the transition thin films 2300 and 2300a may be formed of the materials mentioned in the description of FIG. 1. Of course, the buffer layers 2200a and 2200b may be omitted.

Although planar abrupt MIT structures are used in the embodiment of FIG. 6, stacked abrupt MIT structures may be used. Alternatively, different types of abrupt MIT structures may be formed on the upper and lower surface of the substrate 2000. For example, the first abrupt MIT device chain 2700 on the upper surface of the substrate 2000 may be made up of planar abrupt MIT structures, and the second abrupt MIT device chain 2700a on the lower surface of the substrate 2000 may be made up of stacked abrupt MIT structures.

A high-voltage noise removing circuit to protect an electric and/or electronic system from high-voltage noise using an abrupt MIT device, and an electric and/or electronic system including the high-voltage noise removing circuit will now be described in detail.

Figure 7:
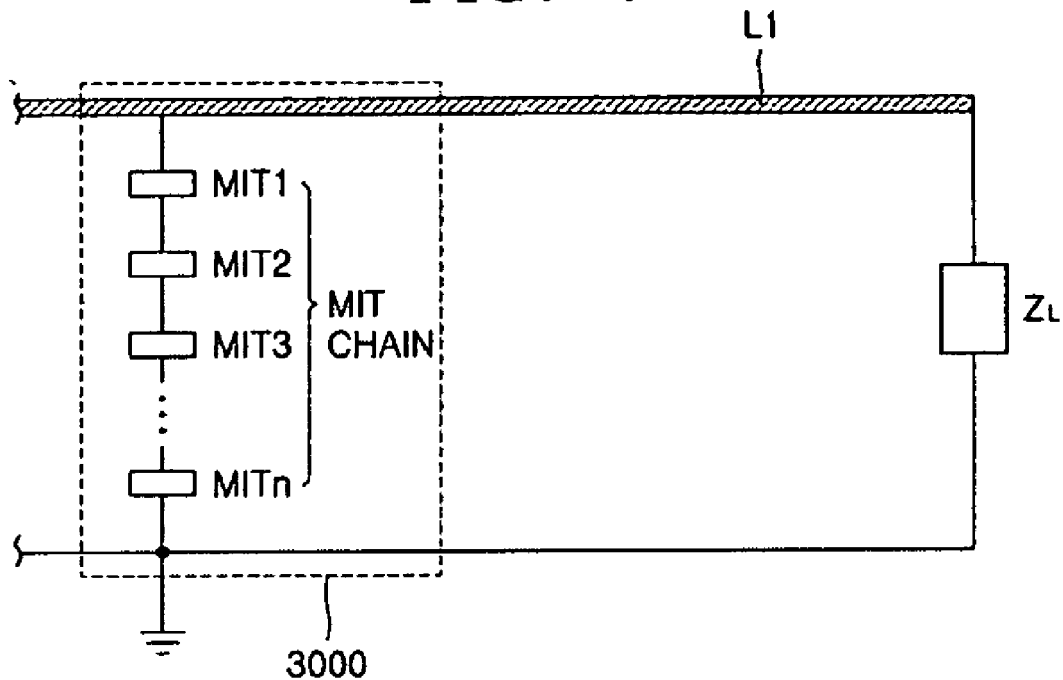
FIG. 7 is a circuit diagram including a high-voltage noise removing circuit comprising a chain of abrupt MIT devices, according to another embodiment of the present invention.

FIG. 7 is a circuit diagram including a high-voltage noise removing circuit 3000 comprising an abrupt MIT device chain, according to an embodiment of the present invention. Referring to FIG. 7, the high-voltage noise removing circuit 3000 is connected to an equivalent impedance $Z_L$ in parallel and includes an abrupt MIT device chain MIT CHAIN obtained by serially connecting abrupt MIT devices MIT1 through MITn to one another.

The equivalent impedance $Z_L$ denotes an electrical and/or electronic system to be protected. The electrical and/or electronic system $Z_L$ may be any electrical and/or electronic system as long as it needs to be protected from high-voltage noise, such as, all sorts of electronic devices, electrical components, electronic systems, or high-voltage electrical systems. In particular, the electrical and/or electronic system $Z_L$ may be preferably electric and/or electronic systems to be protected from super-high voltage noise, such as, high-voltage electrical wires, high-voltage electric parts, home interrupter switches (i.e., fuse boxes), and high-voltage switches. Generally, the electrical and/or electronic system $Z_L$ has pure resistance of about 50Ω. in some cases, the electrical and/or electronic system $Z_L$ may have pure resistance of more than 50Ω. If the electrical and/or electronic system $Z_L$ is a high-voltage switch, it may perform insulation.

Although the abrupt MIT device chain MIT CHAIN may be obtained by first individually forming the abrupt MIT devices MIT1 through MITn and then serially connecting them to each other, the abrupt MIT device chain MIT CHAIN may also be obtained by forming a plurality of abrupt MIT structures on a substrate as in the embodiments of FIGS. 5 and 6. To lower the overall resistance of the abrupt MIT device chain MIT CHAIN and protect each of the abrupt MIT devices, at least one additional abrupt MIT device may be connected to each of the already included abrupt MIT devices in parallel.

In the embodiment of FIG. 7, high-voltage noise equal to or greater than the overall limit voltage corresponding to a sum of the limit voltages of the abrupt MIT devices can be removed using the serially-connected abrupt MIT devices. In other words, when a high voltage equal to or greater than a predetermined voltage is applied to the electrical and/or electronic system $Z_L$, such as, a high-voltage switch, through a power line or a high-voltage wire L1, most of the current generated by the high voltage is bypassed through the abrupt MIT devices, thereby protecting the electrical and/or electronic system $Z_L$.

Although the limit voltage of each of the abrupt MIT devices is low, the overall limit voltage of the abrupt MIT devices can be increased due to a serial connection between the abrupt MIT devices. Hence, a required limit voltage is set, and the electrical and/or electronic system $Z_L$ can be protected from voltages equal to or greater than to the limit voltage. The electrical characteristics generated due to a serial connection between the abrupt MIT devices will be described later in greater detail with reference to the graphs of FIGS. 10A through 10E.

Figure 8:
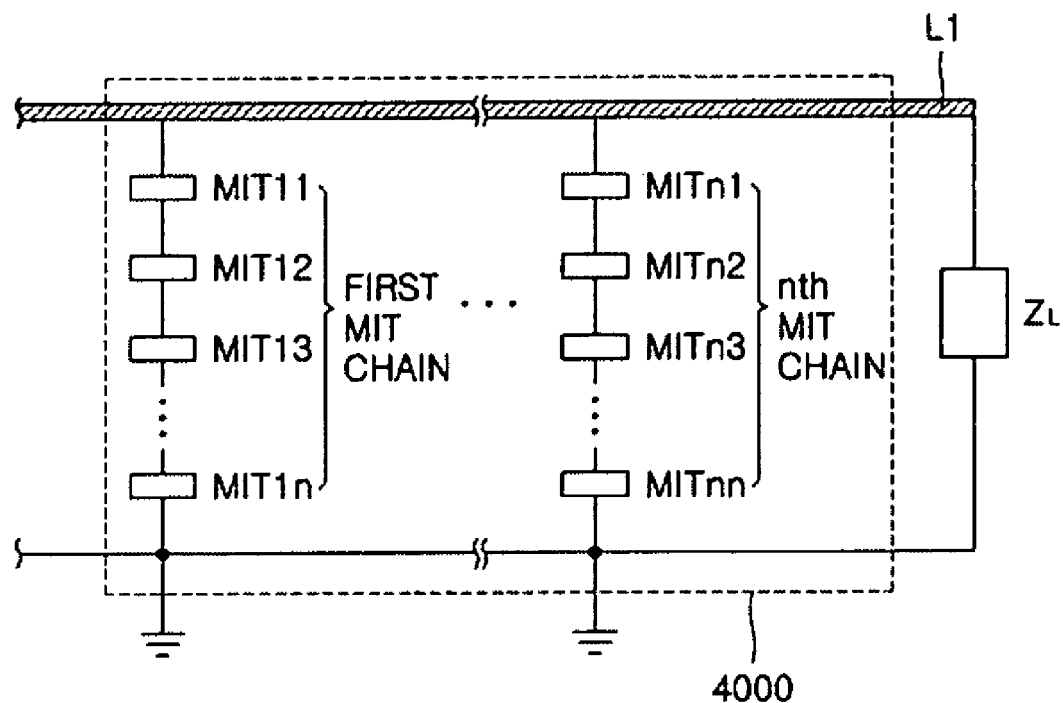
FIG. 8 is a circuit diagram including a high-voltage noise removing circuit comprising a chain of abrupt MIT devices and at least one different chain of abrupt MIT devices connected in parallel to the former mentioned abrupt MIT device chain, according to another embodiment of the present invention.

FIG. 8 is a circuit diagram including a high-voltage noise removing circuit 4000 comprising a plurality of abrupt MIT device chains, namely, first MIT CHAIN to n-th MIT CHAIN, according to another embodiment of the present invention. Referring to FIG. 8, the high-voltage noise removing circuit 4000 is connected to an electrical and/or electronic system $Z_L$ in parallel and includes the first abrupt MIT device chain MIT CHAIN and at least one more abrupt MIT device chain MIT CHAIN (i.e., second through n-th abrupt MIT chains MIT CHAIN) connected to the first abrupt MIT device chain. Each of the abrupt MIT device chains is obtained by serially connecting a plurality of abrupt MIT devices to one another as in the embodiment of FIG. 7. For example, the first abrupt MIT device chain MIT CHAIN is formed by serially connecting n abrupt MIT devices MIT1 through MITn.

In the embodiment of FIG. 8, excessive flow of current to the first abrupt MIT device chain can be prevented by connecting at least one additional abrupt MIT device chain to the first abrupt MIT device chain in parallel. Although each of the abrupt MIT device chain may be obtained by individually forming the abrupt MIT devices MIT1 through MITn and then serially connecting them to each other, it may also be obtained by forming a plurality of abrupt MIT structures on a substrate as in the embodiments of FIGS. 5 and 6.

The parallel connection between the abrupt MIT device chains can be more easily achieved using the parallel connection of the first and second abrupt MIT device chains 2700 and 2700a on both surfaces of the substrate 2000 in the embodiment of FIG. 6. If 3 or more abrupt MIT device chains are necessary, they can be obtained by forming two-dimensional abrupt MIT structures on both surfaces of a substrate and electrically suitably contacting the abrupt MIT structures one another.

Figure 9:
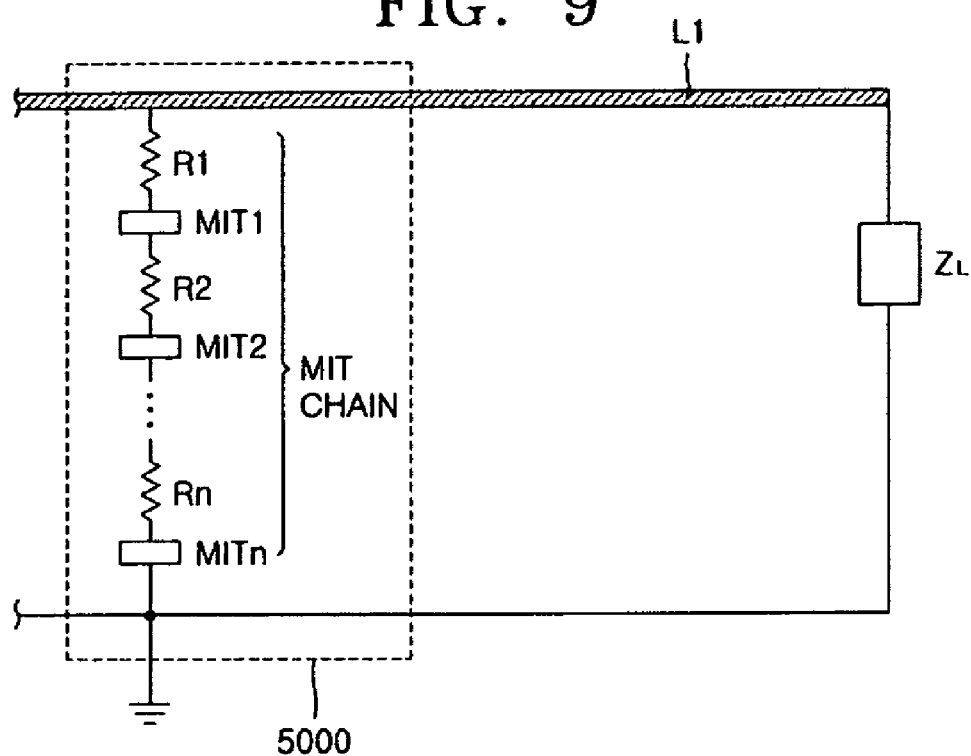
FIG. 9 is a circuit diagram including a high-voltage noise removing circuit comprising an chain of abrupt MIT devices, according to another embodiment of the present invention.

FIG. 9 is a circuit diagram including a high-voltage noise removing circuit 5000 comprising an abrupt MIT device chain, according to another embodiment of the present invention. Referring to FIG. 9, the high-voltage noise removing circuit 5000 is connected to an electric and/or electronic system $Z_L$ in parallel and includes a first abrupt MIT device chain obtained by serially connecting abrupt MIT devices MIT1 through MITn to one another. The high-voltage noise removing circuit 5000 is similar to the high-voltage noise removing circuit 3000 except that the abrupt MIT devices MIT1 through MITn include protective resistances R1 through Rn for protecting the abrupt MIT devices MIT1 through MITn. The protective resistances R1 through Rn are serially connected to the abrupt MIT devices MIT1 through MITn and can lower the overall limit voltage to a required voltage and protect the abrupt MIT devices MIT1 through MITn from a possible destruction caused by small limit resistances of the abrupt MIT devices MIT1 through MITn or application of excessive voltage.

For example, when the electric and/or electronic system $Z_L$ needs to be protected from high-voltage noise having a voltage equal to or greater than 10 kV and there are no protective resistances, an overall limit voltage, which is a sum of the limit voltages of the abrupt MIT devices MIT1 through MITn, should be 10 kV. On the other hand, when there are protective resistances, an applied voltage is distributed into the protective resistances, so that it does not matter that the overall limit voltage is lower than 10 kV. Hence, the number of required abrupt MIT devices can be reduced.

FIGS. 10A through 10E are graphs showing results of experiments of the present invention, namely, electrical characteristics generated due to a serial connection between the abrupt MIT devices included in a high-voltage noise removing circuit according to the present invention. It can be seen from the experiments of the present invention how the overall limit voltage obtained by the serial connection between the abrupt MIT devices varies. The abrupt MIT devices used in the experiments are the planar abrupt MIT devices of FIGS. 2A and 2B.

Figure 10A:
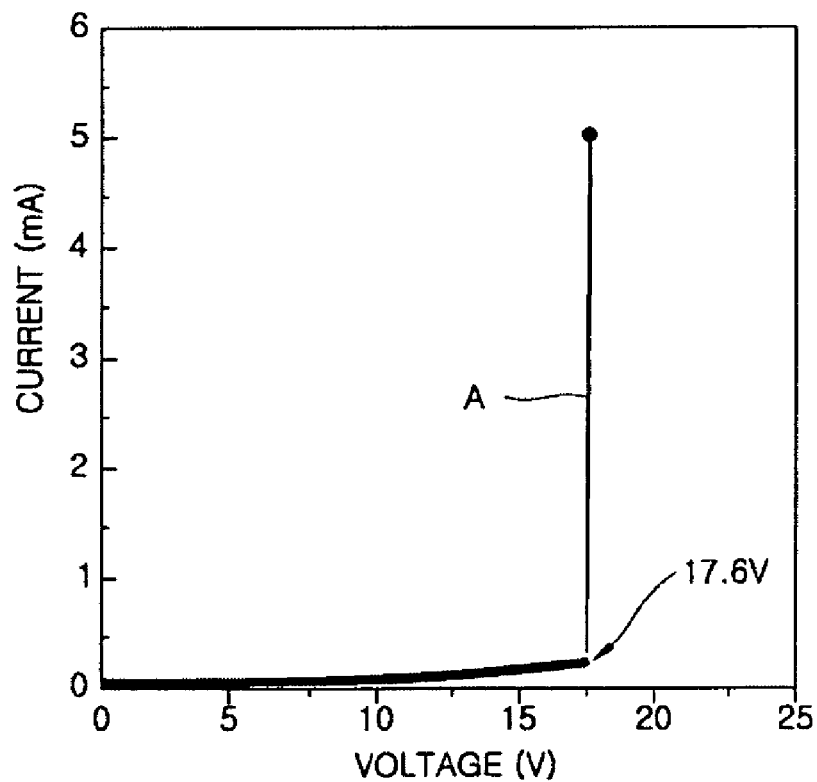
FIGS. 10A through 10E are graphs showing a limit voltage of each of the abrupt MIT devices included in a high-voltage noise removing circuit according to the present invention and the overall limit voltage of the abrupt MIT devices serially connected to one another.

FIG. 10A shows the limit voltage of an abrupt MIT device 1 in which the distance "d" between the first and second electrode thin films 410a and 420a is 20 μm, the width "w" of each of the first and second electrode thin films 410a and 420a is 40 μm, and the transition thin film 300a on a $Al_2O_3$ substrate 100 is formed of vanadium oxide $VO_2$. The abrupt MIT device 1 was subject to an abrupt insulator-to-metal transition indicated by reference character A at 17.6 V. In other words, when a voltage of about 17.6V is applied between the first and second electrode thin films 410a and 420a, an abrupt rise in current, i.e., A, is generated. Hence, the limit voltage of the abrupt MIT device 1 is 17.6V.

Figure 10B:
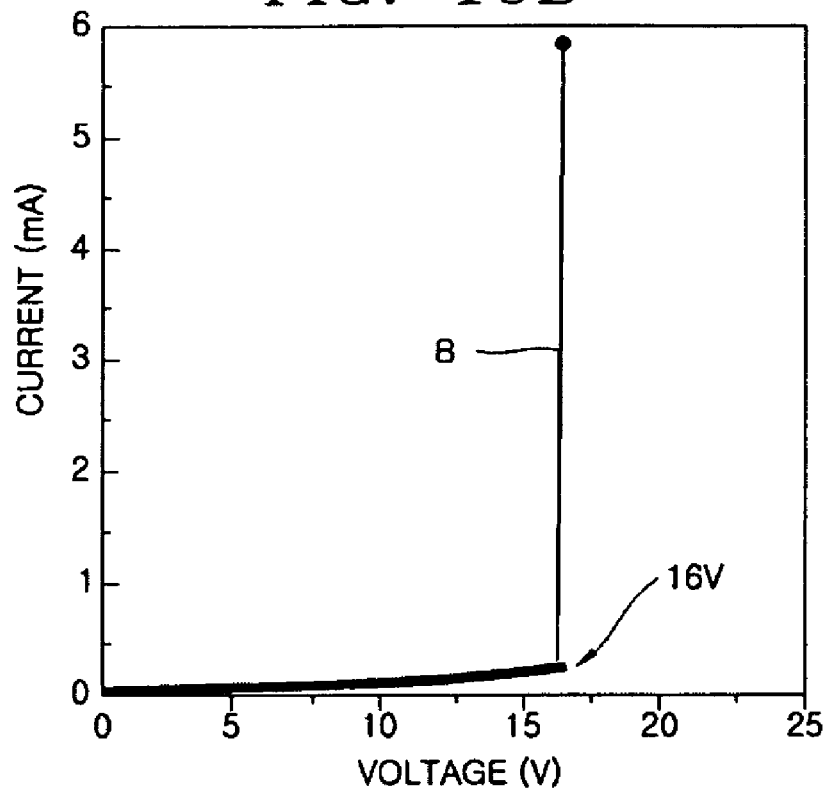

FIG. 10B shows the limit voltage of an abrupt MIT device 2 in which the distance "d" between the first and second electrode thin films 410a and 420a is 20 μm, the width "w" of each of the first and second electrode thin films 410a and 420a is 50 μm, and the transition thin film 300a and the substrate 100 are formed of $VO_2$ and $Al_2O_3$, respectively, as in the abrupt MIT device 1. The abrupt MIT device 2 was subject to an abrupt insulator-to-metal transition indicated by reference character B at 16 V. Hence, the limit voltage of the abrupt MIT device 1 is 16V. Because the width "w" of the abrupt MIT device 2 is greater than that of the abrupt MIT device 1, an electric field formed in the abrupt MIT device 2 is great, and thus a lower limit voltage of the abrupt MIT device 2 than the limit voltage of the abrupt MIT device 1 is somewhat predictable.

Figure 10C:
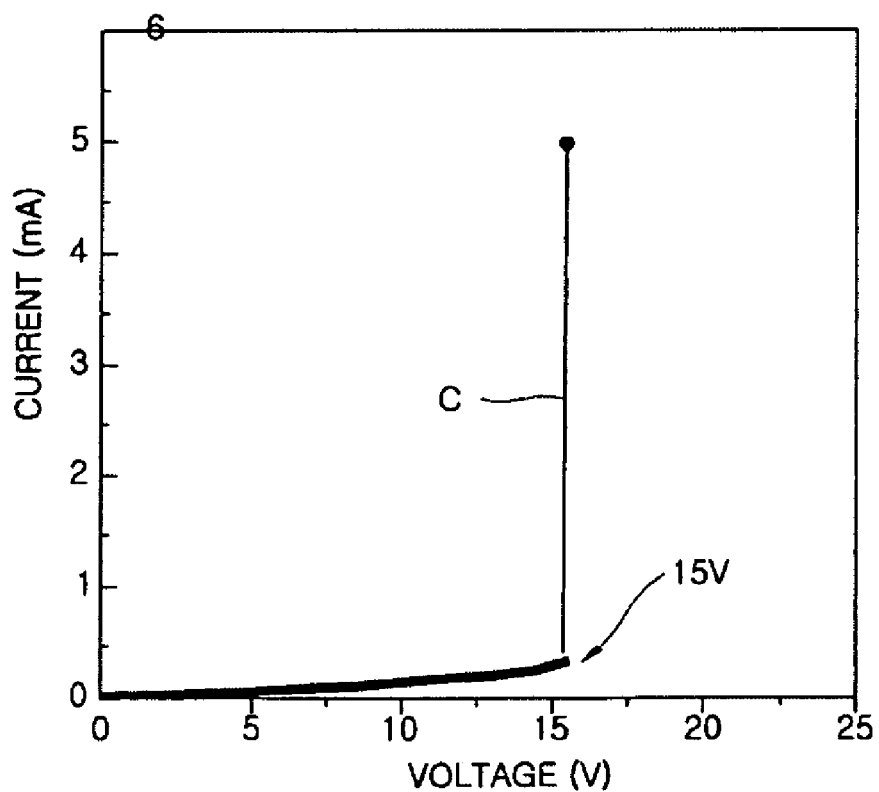

FIG. 10C shows the limit voltage of an abrupt MIT device 3 in which the distance "d" between the first and second electrode thin films 410a and 420a is 20 μm, the width "w" of each of the first and second electrode thin films 410a and 420a is 100 μm, and the transition thin film 300a and the substrate 100 are formed of $VO_2$ and $Al_2O_3$, respectively, as in the abrupt MIT device 1. The abrupt MIT device 3 was subject to an abrupt insulator-to-metal transition indicated by reference character C at 15 V. Hence, the limit voltage of the abrupt MIT device 3 is 15V.

Figure 10D:
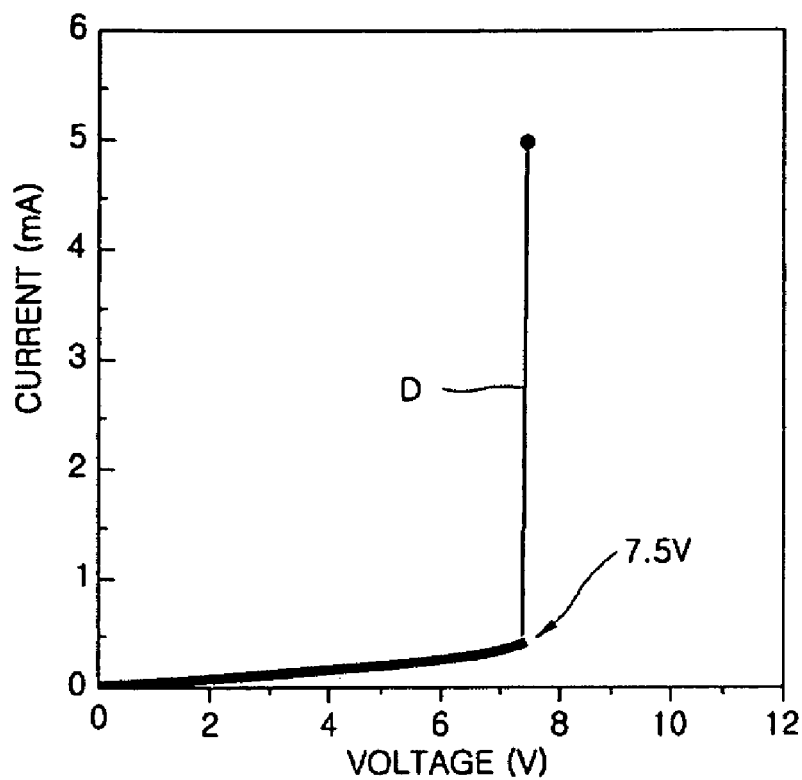

FIG. 10D shows the limit voltage of an abrupt MIT device 4 in which the distance "d" between the first and second electrode thin films 410a and 420a is 5 μm, the width "w" of each of the first and second electrode thin films 410a and 420a is 100 μm, and the transition thin film 300a and the substrate 100 are formed of vanadium oxide $VO_2$ and $Al_2O_3$, respectively, as in the abrupt MIT device 1. The abrupt MIT device 4 was subject to an abrupt insulator-to-metal transition indicated by reference character D at 7.5 V. Hence, the limit voltage of the abrupt MIT device 1 is 7.5V.

It can be seen from the graphs of FIGS. 10A through 10D that the limit voltage greatly varies according to the distance "d" between the first and second electrode thin films 410a and 420a. This indicates that the limit voltage greatly depends upon an upper portion of the transition thin film 300a existing between the first and second electrode thin films 410a and 420a rather than upon lower portions of the transition thin film 300a existing between the first and second electrode thin films 410a and 420a.

Figure 10E:
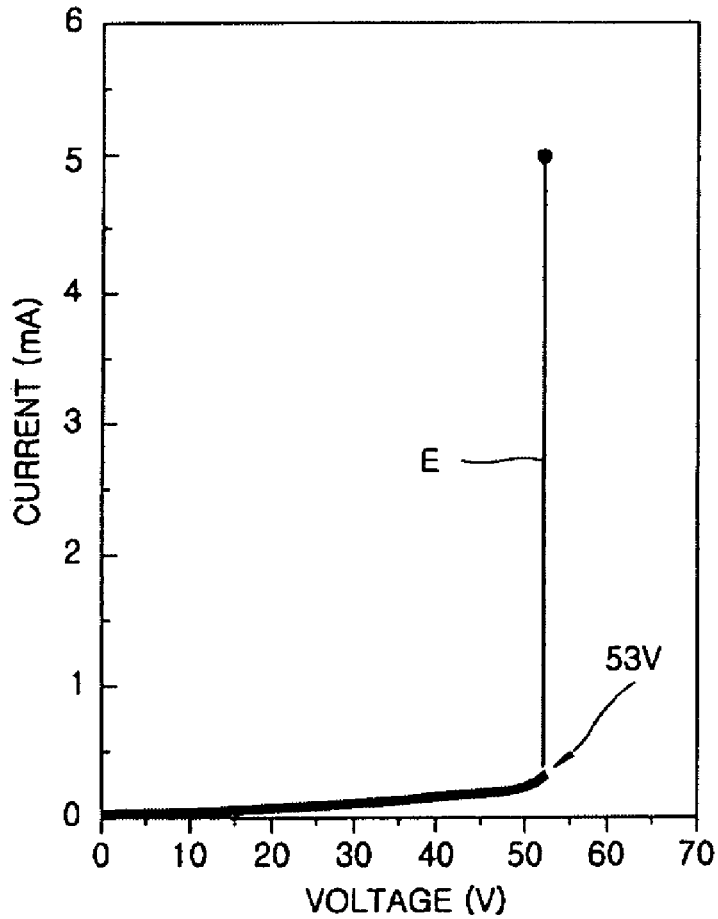

FIG. 10E shows an overall limit voltage of the abrupt MIT devices 1, 2, 3, and 4 serially connected to one another. In other words, the overall limit voltage of the serially-connected abrupt MIT devices 1, 2, 3, and 4 was measured rather than the limit voltage of each of the abrupt MIT devices 1, 2, 3, and 4. The group of the abrupt MIT devices 1, 2, 3, and 4 serially connected to one another was subject to an abrupt insulator-to-metal transition indicated by reference character E at 53 V. Hence, the overall limit voltage of the group of the abrupt MIT devices 1, 2, 3, and 4 is about 53V. The overall limit voltage is almost the same as a sum of the limit voltages of the abrupt MIT devices 1, 2, 3, and 4, i.e., 56.1V. An error in measurement, influences of electric fields generated by adjacent abrupt MIT devices, etc. can be considered as error factors.

A phenomenon that the overall limit voltage of the serially-connected abrupt MIT devices 1, 2, 3, and 4 is the same as a sum of the limit voltages of the abrupt MIT devices 1, 2, 3, and 4 can be explained as follows. In other words, when an applied voltage is less than the overall limit voltage, each of the abrupt MIT devices serves as a resistor with a high resistance, and the applied voltage is distributed to the abrupt MIT devices 1, 2, 3, and 4 according to a voltage distribution rule depending on a serial connection between resistors. The distributed voltages are lower than the limit voltage of each of the abrupt MIT devices 1, 2, 3, and 4. On the other hand, when the applied voltage is equal to or greater than the overall limit voltage, the applied voltage is distributed to the abrupt MIT devices 1, 2, 3, and 4. The distributed voltages are equal to or greater than the limit voltage of each of the abrupt MIT devices 1, 2, 3, and 4. Hence, all of the abrupt MIT devices 1, 2, 3, and 4 are subject to MITs.

It was proven by the experiments that even when the limit voltage of one abrupt MIT device is low, high-voltage noise could be effectively removed by serially connecting a suitable number of abrupt MIT devices with low limit voltages. For example, if high-voltage noise having 2 kV is to be removed from a 1 kV high-voltage wire, high-voltage noise having 2 kV or greater voltage can be removed by serially connecting 7 or 8 abrupt MIT devices each having a limit voltage of 200V. Hence, a rated voltage or a rated signal can be stably transmitted.

If an electric and/or electronic system is damaged at a predetermined voltage or higher, it is securely protected by making the overall limit voltage of abrupt MIT devices lower than the predetermined voltage rather than by equalizing the overall limit voltage of abrupt MIT devices to the predetermined voltage. That's why 10 abrupt MIT devices were not used in the above example.

It can be seen from the above-described experiments that MIT can occur at a super-high voltage by serially connecting abrupt MIT devices having low limit voltages without need to form abrupt MIT devices having limit voltages conforming to the super-high voltage. This advantage can overcome the problem in that a wide transition thin film that can cause abrupt MIT to confront super-high voltage noise cannot be produced.

INDUSTRIAL APPLICABILITY

Therefore, a high-voltage noise removing circuit suitable for each electric and/or electronic system can be designed by suitably adjusting the structure and material of an abrupt MIT device and adequately connecting abrupt MIT devices to one another.

The abrupt MIT device according to the present invention includes a plurality of abrupt MIT devices on a single substrate, and thus is favorable in view of a process for forming a plurality of abrupt MIT devices and serial and parallel connections between the abrupt MIT devices.

Furthermore, the high-voltage noise removing circuit according to the present invention uses serially-connected abrupt MIT devices, thereby effectively removing high-voltage noise much higher than the limit voltage of each of the abrupt MIT devices. The serially-connected abrupt MIT devices can be easily realized by using the plurality of abrupt MIT structures formed on the single substrate and contact lines.

The high-voltage noise removing circuit may be effectively applied to electrical and/or electronic systems to be protected from high-voltage noise, such as, high-voltage electrical wires, high-voltage electric parts, home interrupter switches (i.e., fuse boxes), high-voltage switches, relays, buzzers, electronic parts, power supplies of electronic systems, switching electronic parts, and other electric and electronic parts and systems.

While the present invention has been particularly shown and described with reference to exemplary embodiments thereof, it will be understood by those of ordinary skill in the art that various changes in form and details may be made therein without departing from the spirit and scope of the present invention as defined by the following claims.

The invention claimed is:

1. An abrupt metal-insulator transition (MIT) device comprising:

a substrate; and a first abrupt metal-insulator transition structure and a second abrupt metal-insulator transition structure formed on an upper surface and a lower surface, respectively, of the substrate, wherein each of the first and second abrupt metal-insulator transition structures has a characteristic of an insulator below a predetermined limit voltage and has a characteristic of a metal at or over the limit voltage.

2. The abrupt metal-insulator transition device of claim 1, wherein each of the first and second abrupt metal-insulator transition structures comprises:
   an abrupt metal-insulator transition thin film; and
   at least two electrode thin films contacting the abrupt metal-insulator transition thin film.

3. The abrupt metal-insulator transition device of claim 2, wherein the abrupt metal-insulator transition thin film is formed of at least one material selected from the group consisting of an inorganic semiconductor to which low-concentration holes are added, an inorganic insulator to which low-concentration holes are added, an organic semiconductor to which low-concentration holes are added, an organic insulator to which low-concentration holes are added, a semiconductor to which low-concentration holes are added, an oxide semiconductor to which low-concentration holes are added, and an oxide insulator to which low-concentration holes are added, wherein the above-described materials each include at least one of oxygen, carbon, a semiconductor element (i.e., groups III-V and groups II-IV), a transition metal element, a rare-earth element, and a lanthanum-based element.

4. The abrupt metal-insulator transition device of claim 2, wherein the abrupt metal-insulator transition thin film is formed of an n-type semiconductor-insulator.

5. The abrupt metal-insulator transition device of claim 2, wherein the abrupt metal-insulator transition thin film is formed of at least one material selected from the group consisting of W, Mo, W/Au, Mo/Au, Cr/Au, Ti/AN, Ti/Al/N, Ni/Cr, Al/Au, Pt, Cr/Mo/Au, $YB_2Cu_3O_{7-d}$, Ni/Au, Ni/Mo, Ni/Mo/Au, Ni/Mo/Ag, Ni/Mo/Al, Ni/N, Ni/W/Au, Ni/N/Ag, and Ni/W/Al.

6. The abrupt metal-insulator transition device of claim 1, wherein:
   the first abrupt metal-insulator transition structure comprises:
      an abrupt metal-insulator transition thin film formed on an upper surface of the substrate;
      a first electrode thin film formed on an exposed part of the upper surface of the substrate and covering one lateral surface of the abrupt metal-insulator transition thin film and a part of the upper surface of the abrupt metal-insulator transition thin film; and
      a second electrode thin film formed on the remaining exposed part of the upper surface of the substrate and covering the other lateral surface of the abrupt metal-insulator transition thin film and a part of the upper surface of the abrupt metal-insulator transition thin film such as to face the first electrode thin film; and
   the second abrupt metal-insulator transition structure comprises:
      an abrupt metal-insulator transition thin film formed on a lower surface of the substrate;
      a first electrode thin film formed on an exposed part of the lower surface of the substrate and covering one lateral surface of the abrupt metal-insulator transition thin film and a part of the lower surface of the abrupt metal-insulator transition thin film; and
      a second electrode thin film formed on the remaining exposed part of the lower surface of the substrate and covering the other lateral surface of the abrupt metal-insulator transition thin film and a part of the lower surface of the abrupt metal-insulator transition thin film such as to face the first electrode thin film.

7. The abrupt metal-insulator transition device of claim 1, wherein:
   the first abrupt metal-insulator transition structure comprises:
      a first electrode thin film formed on the upper surface of the substrate;
      an abrupt metal-insulator transition thin film formed on an upper surface of the first electrode thin film; and
      a second electrode thin film formed on an upper surface of the abrupt metal-insulator transition thin film; and
   the second abrupt metal-insulator transition structure comprises:
      a first electrode thin film formed on the lower surface of the substrate;
      an abrupt metal-insulator transition thin film formed on a lower surface of the first electrode thin film; and
      a second electrode thin film formed on a lower surface of the abrupt metal-insulator transition thin film.

8. The abrupt metal-insulator transition device of claim 6, wherein the abrupt metal-insulator transition device comprises:
   a first abrupt metal-insulator transition device chain including a plurality of first abrupt metal-insulator transition structures formed on an upper surface of the substrate; and
   a second abrupt metal-insulator transition device chain including a plurality of second abrupt metal-insulator transition structures formed on a lower surface of the substrate.

9. The abrupt metal-insulator transition device of claim 8, wherein the first abrupt metal-insulator transition structures of the first abrupt metal-insulator transition device chain are serially connected to each other by a serial contact line formed therebetween, and the second abrupt metal-insulator transition structures of the second abrupt metal-insulator transition device chain are serially connected to each other by another serial contact line formed therebetween.

10. The abrupt metal-insulator transition device of claim 9, wherein the first and second abrupt metal-insulator transition device chains are connected to each other in parallel by a parallel contact line that penetrates the substrate.

11. The abrupt metal-insulator transition device of claim 1, wherein the substrate is formed of at least one material selected from the group consisting of Si, $SiO_2$, GaAs, $Al_2O_3$, plastic, glass, $V_2O_5$, $PrBa_2Cu_3O_7$, $YBa_2Cu_3O_7$, MgO, $SrTiO_3$, Nb-doped $SrTiO_3$, and silicon-on-insulator (SOI).

12. The abrupt metal-insulator transition device of claim 1, further comprising buffer layers formed on the upper surface and the lower surface of the substrate.

13. The abrupt metal-insulator transition device of claim 12, wherein each of the buffer layers comprises one of a $SiO_2$ film and a $Si_3N_4$ film.

14. An abrupt metal-insulator transition device comprising:
   a substrate; and
   an abrupt metal-insulator transition device chain including at least two abrupt metal-insulator transition structures spaced apart from each other on the substrate, wherein each of the abrupt metal-insulator transition structures comprises an abrupt metal-insulator transition thin film and at least two electrode thin films contacting the abrupt metal-insulator transition thin film.

15. The abrupt metal-insulator transition device of claim 14, wherein the abrupt metal-insulator transition structures of the abrupt metal-insulator transition device chain are serially connected to each other by a serial contact line formed on the substrate therebetween.

16. A high-voltage noise removing circuit comprising an abrupt metal-insulator transition device chain connected in parallel to an electric and/or electronic system to be protected, wherein the abrupt metal-insulator transition device chain comprises at least two abrupt metal-insulator transition devices serially connected to each other and each of the abrupt metal-insulator transition devices has a characteristic of an insulator below a predetermined limit voltage and has a characteristic of a metal at or over the limit voltage.

17. The high-voltage noise removing circuit of claim 16, further comprising at least one abrupt metal-insulator transition device chain connected in parallel to the abrupt metal-insulator transition device chain.

18. The high-voltage noise removing circuit of claim 16, further comprising at least one abrupt metal-insulator transition device connected in parallel to each of the abrupt metal-insulator transition devices.

19. The high-voltage noise removing circuit of claim 16, wherein each of the abrupt metal-insulator transition devices comprises a protective resistance for protecting each of the abrupt metal-insulator transition devices.

20. The high-voltage noise removing circuit of claim 16, wherein the abrupt metal-insulator transition device chain has an overall limit voltage corresponding to a sum of the limit voltages of the abrupt metal-insulator transition devices, and high-voltage noise having a voltage equal to or greater than the overall limit voltage is removed.

21. A high-voltage noise removing circuit comprising an abrupt metal-insulator transition device connected in parallel to an electric and/or electronic system to be protected, including a substrate and an abrupt metal-insulator transition device chain obtained by serially connecting at least two abrupt metal-insulator transition structures.

22. The high-voltage noise removing circuit of claim 21, further comprising at least one abrupt metal-insulator transition device chain connected in parallel to the abrupt metal-insulator transition device chain.

23. The high-voltage noise removing circuit of claim 21, wherein each of the abrupt metal-insulator transition structures comprises:
    an abrupt metal-insulator transition thin film; and
    at least two electrode thin films contacting the abrupt metal-insulator transition thin film.

24. The high-voltage noise removing circuit of claim 21, wherein the abrupt metal-insulator transition structures of the abrupt metal-insulator transition device chain are serially connected to each other by a serial contact line formed on the upper surface of the substrate.

25. The high-voltage noise removing circuit of claim 21, wherein the abrupt metal-insulator transition device chain comprises:
    a first abrupt metal-insulator transition device chain formed on the upper surface of the substrate, including at least two abrupt metal-insulator transition structures serially connected to each other; and
    a second abrupt metal-insulator transition device chain formed on the lower surface of the substrate, including at least two abrupt metal-insulator transition structures serially connected to each other.

26. The high-voltage noise removing circuit of claim 25, wherein:
    the abrupt metal-insulator transition structures of the first abrupt metal-insulator transition device chain are serially connected to each other by a serial contact line formed on the upper surface of the substrate; and
    the abrupt metal-insulator transition structures of the second abrupt metal-insulator transition device chain are serially connected to each other by another serial contact line formed on the lower surface of the substrate.

27. The high-voltage noise removing circuit of claim 26, wherein the first and second abrupt metal-insulator transition device chains are connected to each other in parallel by a parallel contact line that penetrates the substrate.

28. An electric and/or electronic system comprising:
    an electric and/or electronic system to be protected; and
    a high-voltage noise removing circuit including an abrupt metal-insulator transition device chain connected in parallel to the electric and/or electronic system, the abrupt metal-insulator transition device chain obtained by serially connecting at least two abrupt metal-insulator transition devices to each other, wherein each of the abrupt metal-insulator transition devices has a characteristic of an insulator below a predetermined limit voltage and has a characteristic of a metal at or over the limit voltage.

29. The electric and/or electronic system of claim 28, wherein the high-voltage noise removing circuit further comprises at least one abrupt metal-insulator transition device chain connected in parallel to the abrupt metal-insulator transition device chain.

30. The electric and/or electronic system of claim 28, wherein each of the abrupt metal-insulator transition devices comprises a protective resistance for protecting each of the abrupt metal-insulator transition devices.

31. The electric and/or electronic system of claim 28, wherein the abrupt metal-insulator transition device chain has an overall limit voltage corresponding to a sum of the limit voltages of the abrupt metal-insulator transition devices, and high-voltage noise having a voltage equal to or greater than the overall limit voltage is removed.

32. The electric and/or electronic system of claim 28, wherein the electric and/or electronic system is a high-voltage switch which blocks a high voltage.

* * * * *